(12) United States Patent
Podgorski (10) Patent No.: US 6,295,032 B1
(45) Date of Patent: Sep. 25, 2001

(54) BROADBAND HORN ANTENNAS AND ELECTROMAGNETIC FIELD TEST FACILITY

(76) Inventor: Andrew S. Podgorski, 332 Crestview Rd., Ottawa (CA), K1H 5G6

( * ) Notice: Subject to any disclaimer, the term of this patent is extended or adjusted under 35 U.S.C. 154(b) by 0 days.

(21) Appl. No.: 09/572,946

(22) Filed: May 18, 2000

(51) Int. Cl.[7] .................................................. H01Q 13/00
(52) U.S. Cl. ............................................ 343/703; 343/786
(58) Field of Search .................................. 343/703, 786; H01Q 13/02

(56) References Cited

U.S. PATENT DOCUMENTS

5,440,316   8/1995   Podgorski ............................ 343/786
5,982,331   11/1999  Podgorski ............................ 343/703

*Primary Examiner*—Michael C. Wimer
(74) *Attorney, Agent, or Firm*—Jones, Tullar & Cooper PC (57) ABSTRACT

Electromagnetic radiating structures suitable for use as antennas or in electromagnetic field test facilities. An electromagnetic field test facility is a test enclosure used for observing the behaviour of equipment in the presence of strong electromagnetic fields and for detecting radiation from the equipment. A broadband Gigahertz field electromagnetic test facility is also disclosed in which an array of horn antennas is used to illuminate a relatively large test area at high power densities, or to measure radiation from tested equipment in a frequency range extending from DC to hundreds of Gigahertz.

20 Claims, 12 Drawing Sheets

BROADBAND HORN ANTENNAS AND ELECTROMAGNETIC FIELD TEST FACILITY

CROSS REFERENCE TO RELATED APPLICATIONS

"Not Applicable"

STATEMENT REGARDING FEDERALLY SPONSORED RESEARCH OR DEVELOPMENT

"Not Applicable"

BACKGROUND OF THE INVENTION

1. Field of the Invention

This application relates to electromagnetic radiating structures suitable for use as antennas and in electromagnetic field test facilities used for observing the behaviour of equipment in the presence of strong electromagnetic fields and for detecting radiation from the equipment.

Continuous Wave (cw) measurement of electromagnetic susceptibility and radiated interference have been carried out using multiple antennas whose electromagnetic properties must be well known in the near field or using TEM cells whose volume and/or frequency limits make them unsuitable for broadband testing of large electronic sub-systems more than a few meters in height.

2. Background Information

Electromagnetic field test facilities described as "simulators" are disclosed in U.S. Pat. No. 5,440,316 issued Aug. 8, 1995 and U.S. Pat. No. 5,982,331 issued Nov. 8, 1995 both to Podgorski. The structure shown in FIGS. 1 and 2 of U.S. Pat. No. 5,982,331 is an electromagnetic field test facility employing vertically polarized electromagnetic waves in the test area and the structure shown in FIG. 3 of U.S. Pat. No. 5,982,331 is an electromagnetic field test facility employing horizontally polarized waves in the test area of a semi-anechoic chamber. The structure shown in FIGS. 9 and 10 of U.S. Pat. No. 5,982,331 is an electromagnetic field test facility employing vertically polarized electromagnetic waves in the test area and the structure shown in FIG. 12 of U.S. Pat. No. 5,982,331 is an electromagnetic field test facility employing horizontally polarized waves in the test area of an anechoic chamber.

Recently issued Bellcore's Generic Requirements Criteria GR 1089-CORE, for telecommunications equipment, indicates the need for apparatus to perform E-field (electric field) radiated immunity and emission testing from 10 kHz to 10 GHz, and H-field (magnetic field) radiated emission testing from 60 Hz to 30 MHz.

The current requirement for the standard size of testing facilities is a distance between the test antenna and the tested object of 3 m, 5 m, and 10 m with the size of testing area limited to 1.5 m×1.5 m. The broadband Gigahertz field electromagnetic field test facility of U.S. Pat. No. 5,982,331 can fulfil the standard facility size requirements with the frequency of operation from DC to 5 GHz. If the size of the testing area is limited to 0.5 m×0.5 m, the existing configuration of the broadband Gigahertz field facility allows it to exceed the upper frequency limit of 10 GHz dictated by Bellcore GR 1089-CORE.

BRIEF SUMMARY OF THE INVENTION

This application relates to broadband antennas and to broadband Gigahertz field test facility structures using the antennas to produce and to measure electromagnetic fields (E-field and H-field) in the test area. Antennas at different orientations can be used simultaneously to produce an electromagnetic field net polarization that can be controlled electrically, allowing for automated control and thereby reducing the testing time.

Low frequency of operation of a horn antenna is limited by the size of the antenna aperture (mouth of the antenna) and the upper frequency of operation is limited by the angle of the angular opening of the horn antenna. The emission and immunity testing of objects requires that not only the frequency of testing be followed, but as well in case of immunity testing, a specific power density must be attained. With a significant increase in the test frequency, there is a need for increasing the upper frequency of operation of horn antennas. With the increasing upper frequency limit of the horn antenna, the antenna beamwidth is decreased, resulting in a smaller area of illumination of the tested object. To maintain the required illumination of the tested object at higher frequencies, the following two approaches are used:

for limited size of tested objects and limited power densities, use of a single antenna with a lens if necessary. In a single antenna, if a lens is installed, the lens can either be converging (if higher power is needed) or diverging (if larger objects at low power are to be tested).

for testing of very large size objects at very high power densities, the use of antenna arrays is required. The antenna array can have individual antenna beams uniform, converging or diverging. Individual antennas can be equipped with either diverging or converging lenses or be without any lenses.

In its antenna aspect the invention relates to an antenna comprising, a horn having a septum therein adjacent one wall thereof and electrically isolated from the horn, the end of the septum outside the mouth of the horn curving towards the adjacent wall, an electromagnetic absorbing array surrounding the mouth of the horn, and resistive coupling between the forward edge of the septum and the wall of the horn adjacent to it to absorb low frequency electromagnetic energy propagated between the septum and its adjacent wall.

In an electromagnetic field test facility aspect the invention relates to an electromagnetic field test facility consisting of a semi-anechoic or anechoic chamber with inwardly facing horn antennas at opposite facing walls, the antennas being connected to conducting arrays extending forwardly into the chamber and defining a test volume therein, having the improvement comprising a pair of inwardly directed antenna arrays located at corners of the chamber to illuminate the test volume whereby high frequencies can be tested at selected polarization.

In another electromagnetic field test facility aspect the invention relates to a electromagnetic field test facility comprising a closed conducting reverberation chamber, first and second pairs of opposed arrays of conductors orthogonally arranged adjacent opposed walls of the chamber and defining a test volume therebetween, a radiating horn assembly positioned in an end wall of the assembly to establish an electromagnetic field in the test volume, and means terminating the arrays of conductors to establish a selected polarization of said electromagnetic field.

In order to perform the tests required by GR 1089-CORE, E-field radiated immunity and emission testing from 10 kHz to 10 GHz, (and if required in the future up to 100 GHz), in the standard size of testing facilities 3 m, 5 m, 10 m or larger, and for the size of testing area 1.5 m×1.5 m (or larger), the present application teaches a further modification to known broadband Gigahertz field test facility.

Although the broadband Gigahertz field test facility of U.S. Pat. Nos. 5,440,316 and 5,982,331 operates from DC, it has now been found that with suitable alteration in terminating connections the facility can also be used to perform H-field (magnetic field) radiated emission testing from 60 Hz to 30 MHz—as required by Bellcore GR 1089-CORE.

BRIEF DESCRIPTION OF THE SEVERAL VIEWS OF THE DRAWINGS

The foregoing, and additional objects, features, and advantages of the present invention will become apparent to those of skill in the art from the following detailed description of preferred embodiments thereof, taken with the accompanying drawings, in which.

DETAILED DESCRIPTION OF THE INVENTION

Figure 1:
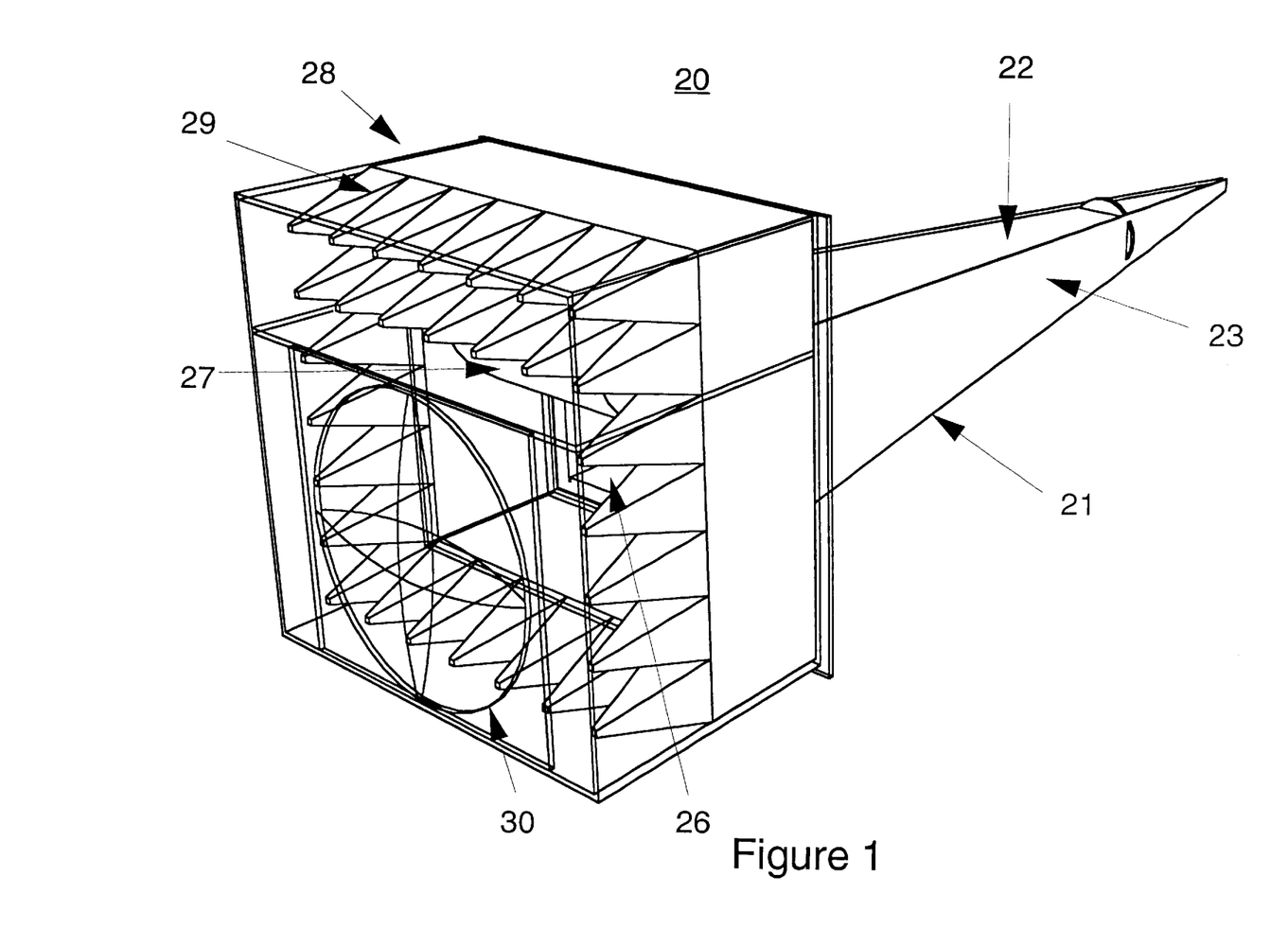
FIG. 1 is a perspective view of an antenna structure in combination with a lens.

FIG. 1 shows an antenna structure 20 which can be used as part of a broadband electromagnetic field test facility. It consists of a horn 21 having four walls 22 23 and a mouth 26. Within the horn, a conducting plate or septum 27 which is electrically isolated from the horn, is positioned adjacent and spaced from the upper wall 22 of the horn and the end of the septum outside the mouth of the horn is curved towards the upper wall. An electromagnetic absorbing array 28 consisting of cones of absorbing material (carbon loaded foam) 29 surrounding the mouth, absorbs undesired radiation. The undesired electromagnetic field generated above the top surface of the septum is absorbed by the portion of absorbing array at the top edge of the mouth of the horn. The absorbing arrays at the remaining edges of the mouth of the horn absorb the energy of extraneous side lobes. These absorbing arrays are critical for enabling operation at high field strengths. These absorbers are also useful to absorb electromagnetic fields from received signals (for example from an antenna at the opposite end of a test chamber), scattered by the edges of the mouth of the horn. An optional lens 30 is shown which can be used to control the beamwidth. A converging lens is used to produce a narrower more intense beam. A diverging lens is used to produce a wider beam.

Figure 2:
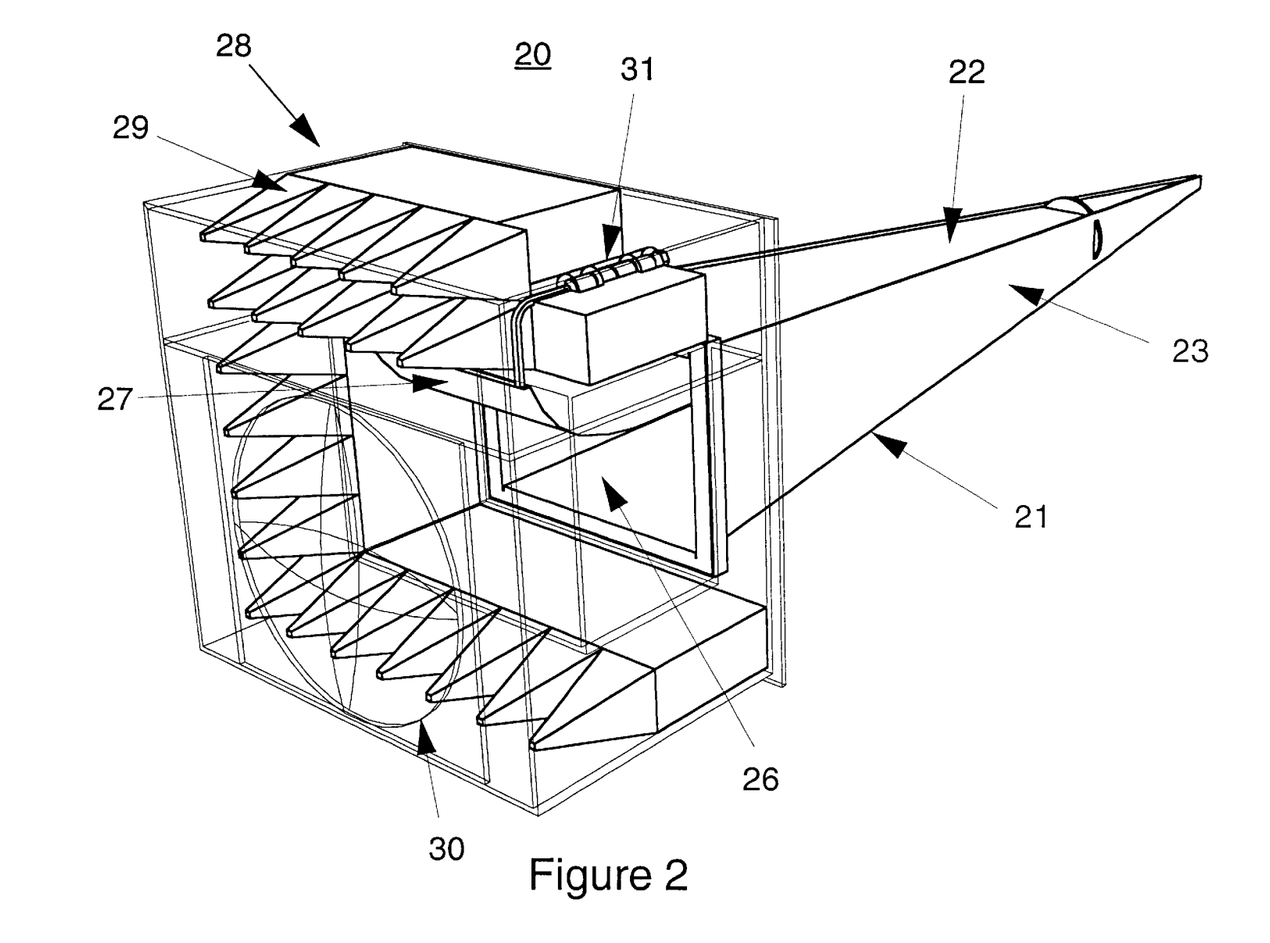
FIG. 2 is a cut away perspective view showing one of the two terminating resistors of the antenna of FIG. 1.

FIG. 2 shows a cutaway view of the antenna of FIG. 1 showing one of two terminating resistors 31 mounted at the corners of the septum. The antenna and resistors shown are built to sustain high voltages in the order of 20 to 50 KV at DC. Electromagnetic fields up to hundreds of KV/m can thus be generated with a single antenna.

Figure 3:
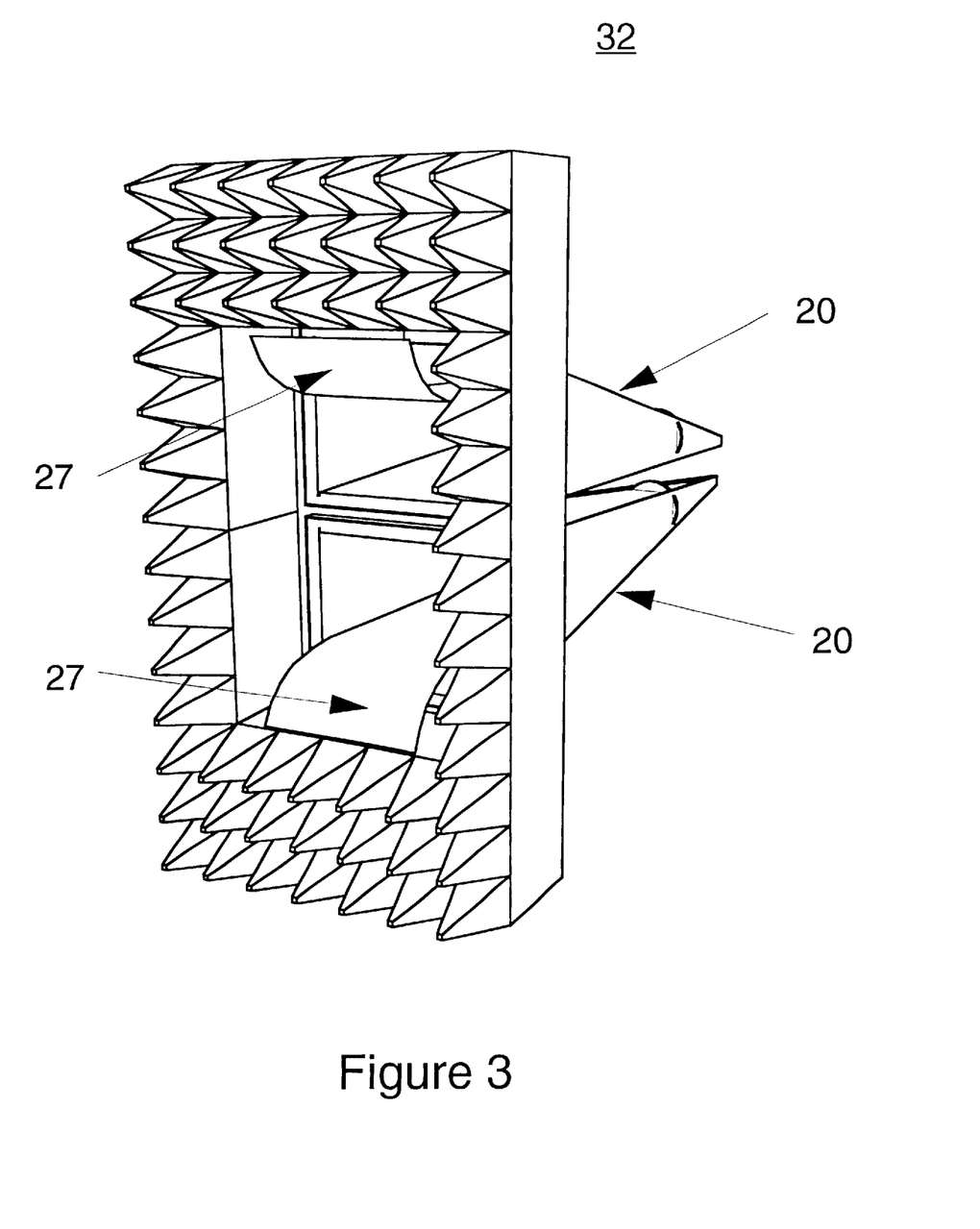
FIG. 3 is a perspective view of a dual antenna.

FIG. 3 shows a dual antenna 32 based on the design of the antenna shown in FIG. 1. The dual antenna consists of two individual antennas 20 installed back-to-back and are driven by signal sources 180° out of phase. The septums 27 are located opposite each other. The resulting electromagnetic field strength is not only double that produced by a single antenna but the field is much wider and more uniform. This antenna can be used to provide radiation symmetrical with respect to a ground plane.

The single antennas 20 and the dual antennas 32 can be combined into arrays. Arrays improve the signal strength and field uniformity over the output of single antennas. For example, by building arrays of 100 of the antennas of FIGS. 1 and 2, electromagnetic fields on the order of MV/m can be generated.

Figure 4:
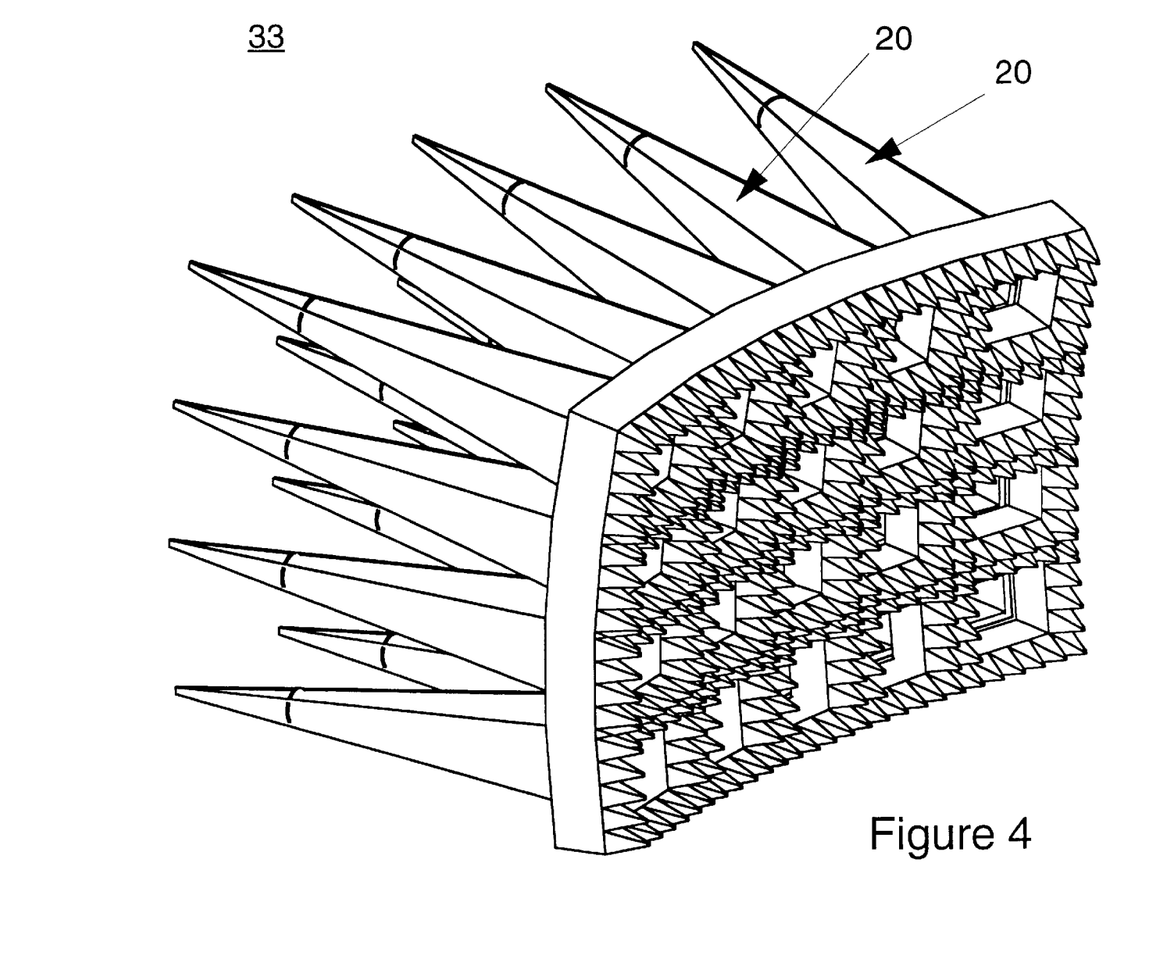
FIG. 4 is a perspective view of a converging array of antennas.
Figure 5:
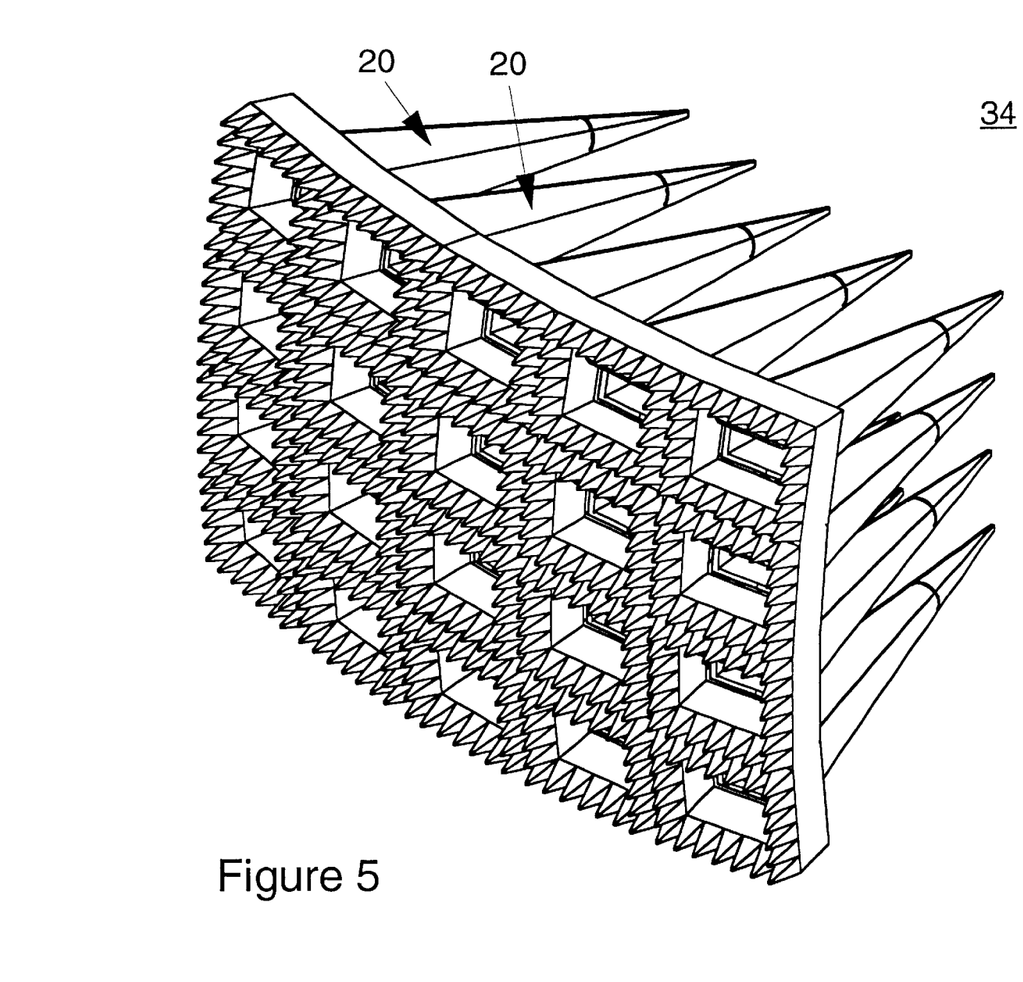
FIG. 5 is a perspective view of a diverging array of antennas.

A converging array of antennas 33 as shown in FIG. 4 can set up a common focus for the individual antennas 20 thereby concentrating the resulting output beam. Conversely, a diverging array of antennas 34 as shown in FIG. 5 increases the field width and coverage area as compared to the output of a planar array of antennas. This has applications in illuminating large tested structures within a test enclosure of FIG. 11, or in case of multi-point communications.

Figure 6:
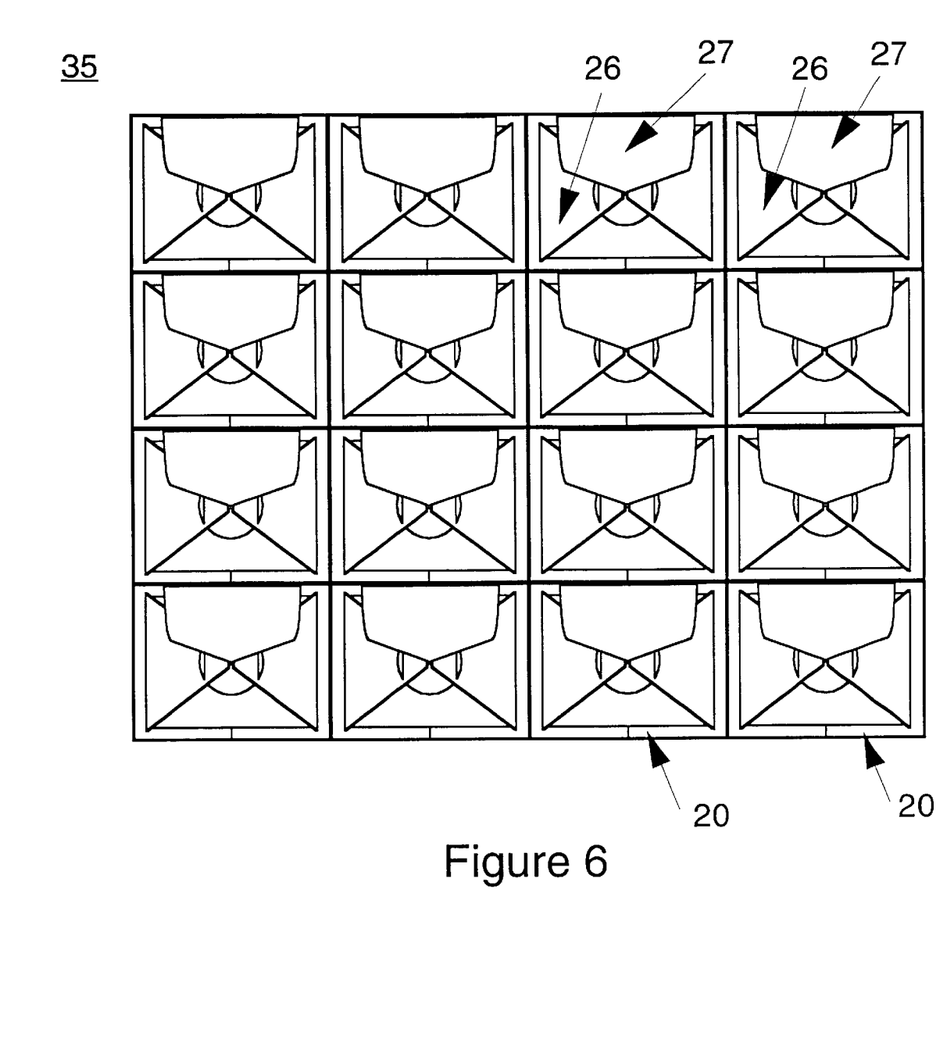
FIG. 6 is a face view of a vertical polarization array of antennas.

FIG. 6 shows a face view of a vertical polarization array of antennas 35. The mouths 26 of individual antennas 20 are visible. All septums 27 of are placed horizontally. The input signals applied to individual antennas of the array are in the same phase. The electromagnetic field in front of the antenna array (vertically polarized), results from combined fields generated by individual antennas. Depending upon the angular resolution of the individual antenna beams and the antenna array focusing or de-focusing, the combined electromagnetic field can be tailored to meet the electromagnetic field requirements (intensity, distance, area of illumination). For clarity, the absorbing arrays of the individual antennas are not shown.

Figure 7:
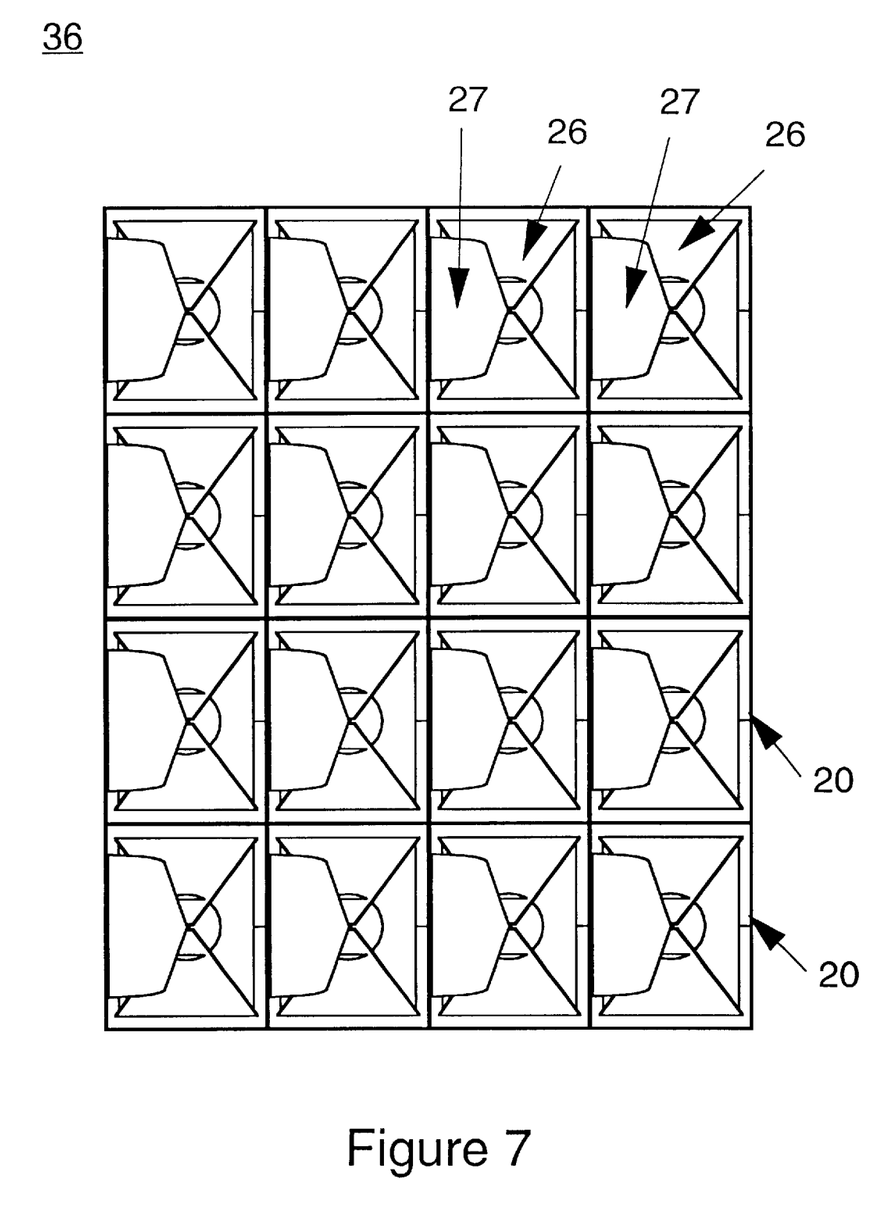
FIG. 7 is a face view of a horizontal polarization array of antennas.

FIG. 7 shows a face view of a horizontal polarization array of antennas 36. The mouths 26 of individual antennas 20 are visible. All septums 27 of are placed vertically. The input signals applied to individual antennas of the array are in the same phase. The electromagnetic field in front of the antenna array (horizontally polarized), results from combined fields generated by individual antennas. Depending upon the angular resolution of the individual antenna beams and the antenna array focusing or de-focusing, the combined electromagnetic field can be tailored to meet the electromagnetic field requirements (intensity, distance, area of illumination). For clarity, the absorbing arrays of the individual antennas are not shown.

Figure 8:
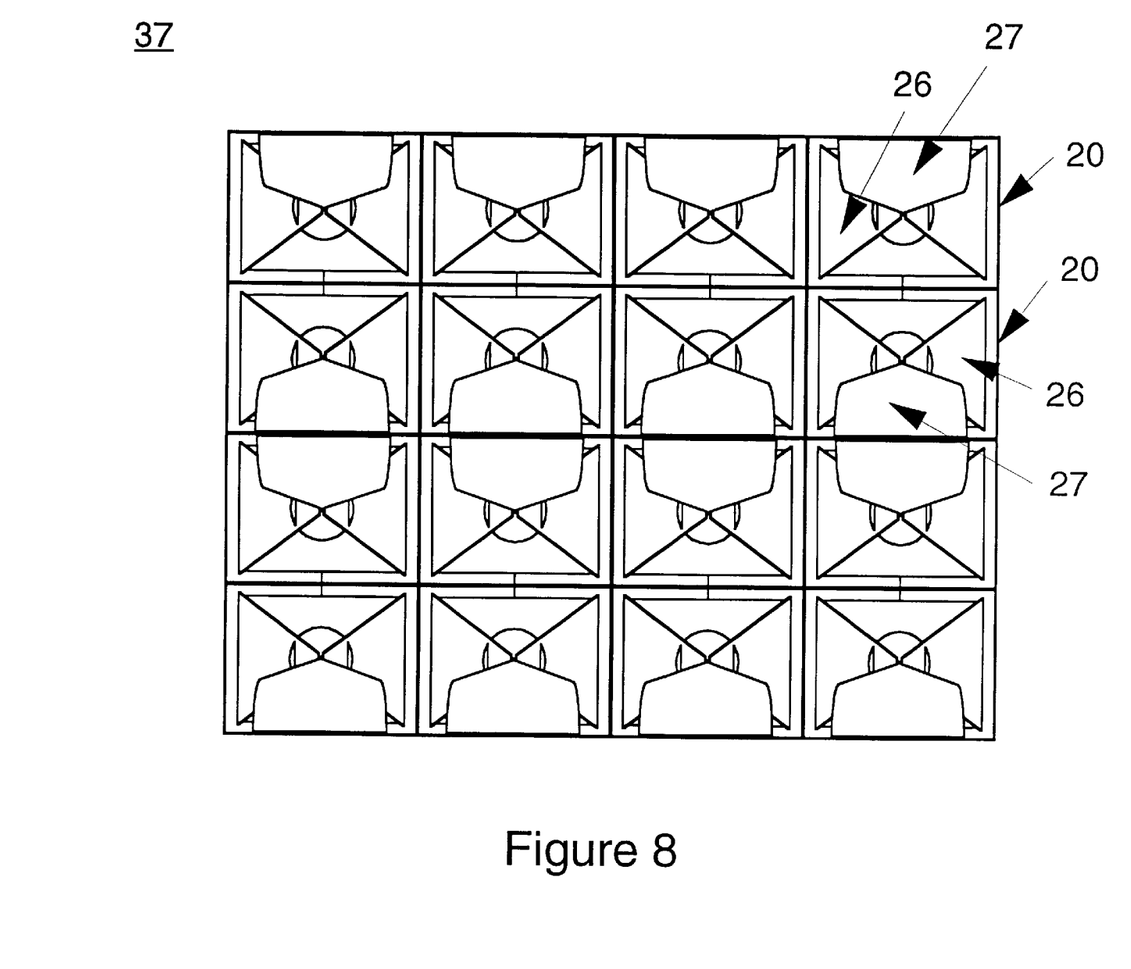
FIG. 8 is a face view of a vertical polarization array of dual antennas.

FIG. 8 shows a face view of a vertical polarization array of dual antennas 37. The array can be constructed with dual antennas 32 such as those of FIG. 3 or with rows of individual antennas 20 such as those of FIG. 1. The following describes the construction using individual antennas: All septums 27 of individual antennas are placed horizontally. The antennas in each row have the same orientation. The input signals applied to the antennas in each row are in the same phase. The antennas of alternate rows have both their orientation and the phase of the input signal inverted by 180°. The resulting electromagnetic field output of each of the rows thus has the same polarization and the field amplitudes are additive. The electromagnetic field in front of the antenna array (vertically polarized), results from combined fields generated by individual antennas. Depending upon the angular resolution of the individual antenna beams and the antenna array focusing or de-focusing, the combined electromagnetic field can be tailored to meet the electromagnetic field requirements (intensity, distance, area of illumination). For clarity, the absorbing arrays of the individual antennas are not shown.

Figure 9:
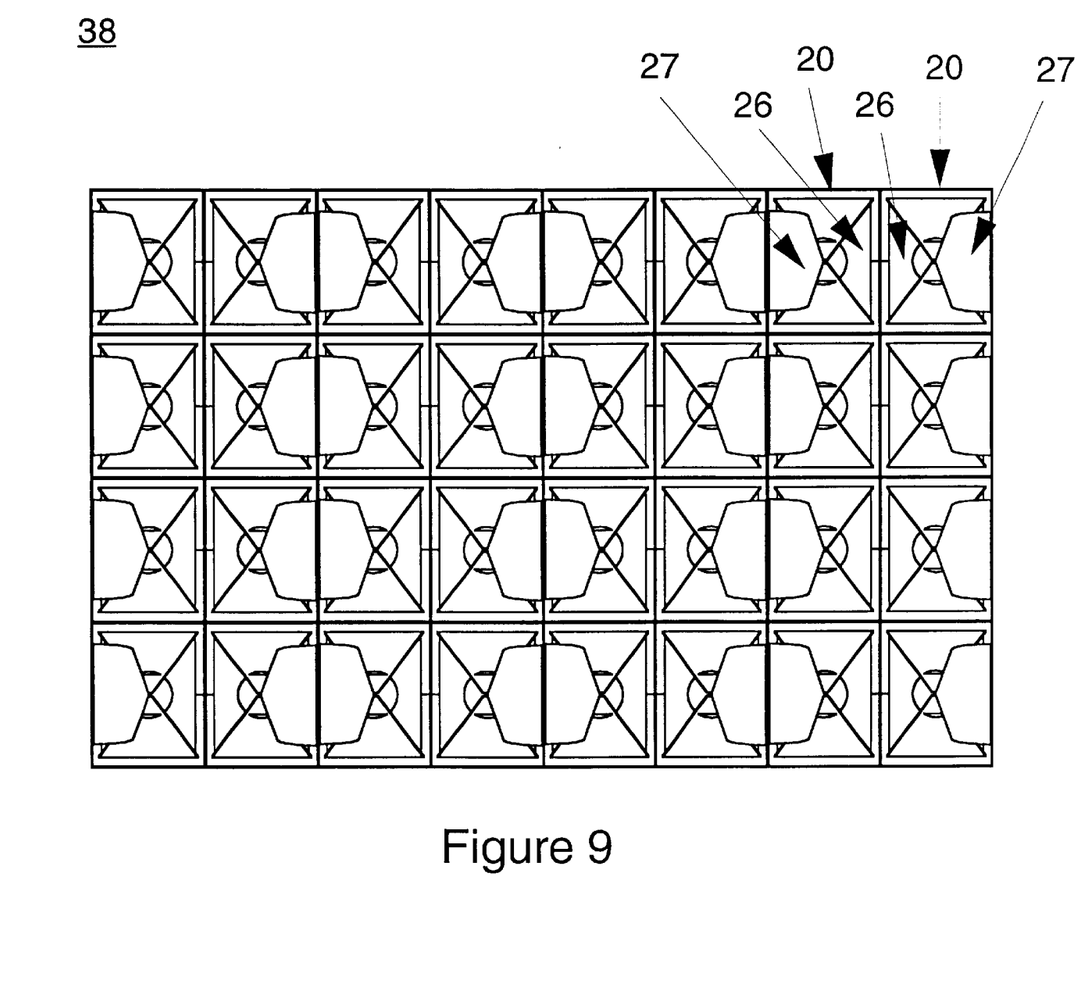
FIG. 9 is a face view of a horizontal polarization array of dual antennas.

FIG. 9 shows a face view of a horizontal polarization array of dual antennas 38. The array can be constructed with dual antennas 32 such as those of FIG. 3 or with columns of individual antennas 20 such as those of FIG. 1. The following describes the construction using individual antennas:

All septums 27 of individual antennas are placed vertically. The antennas in each column have the same orientation. The input signals applied to the antennas in each column are in the same phase. The antennas of alternate columns have both their orientation and the phase of the input signal inverted by 180°. The resulting electromagnetic field output of each of the columns thus has the same polarization and the field amplitudes are additive. The electromagnetic field in front of the antenna array (horizontally polarized), results from combined fields generated by individual antennas. Depending upon the angular resolution of the individual antenna beams and the antenna array focusing or de-focusing, the combined electromagnetic field can be tailored to meet the electromagnetic field requirements (intensity, distance, area of illumination). For clarity, the absorbing arrays of the individual antennas are not shown.

Figure 10:
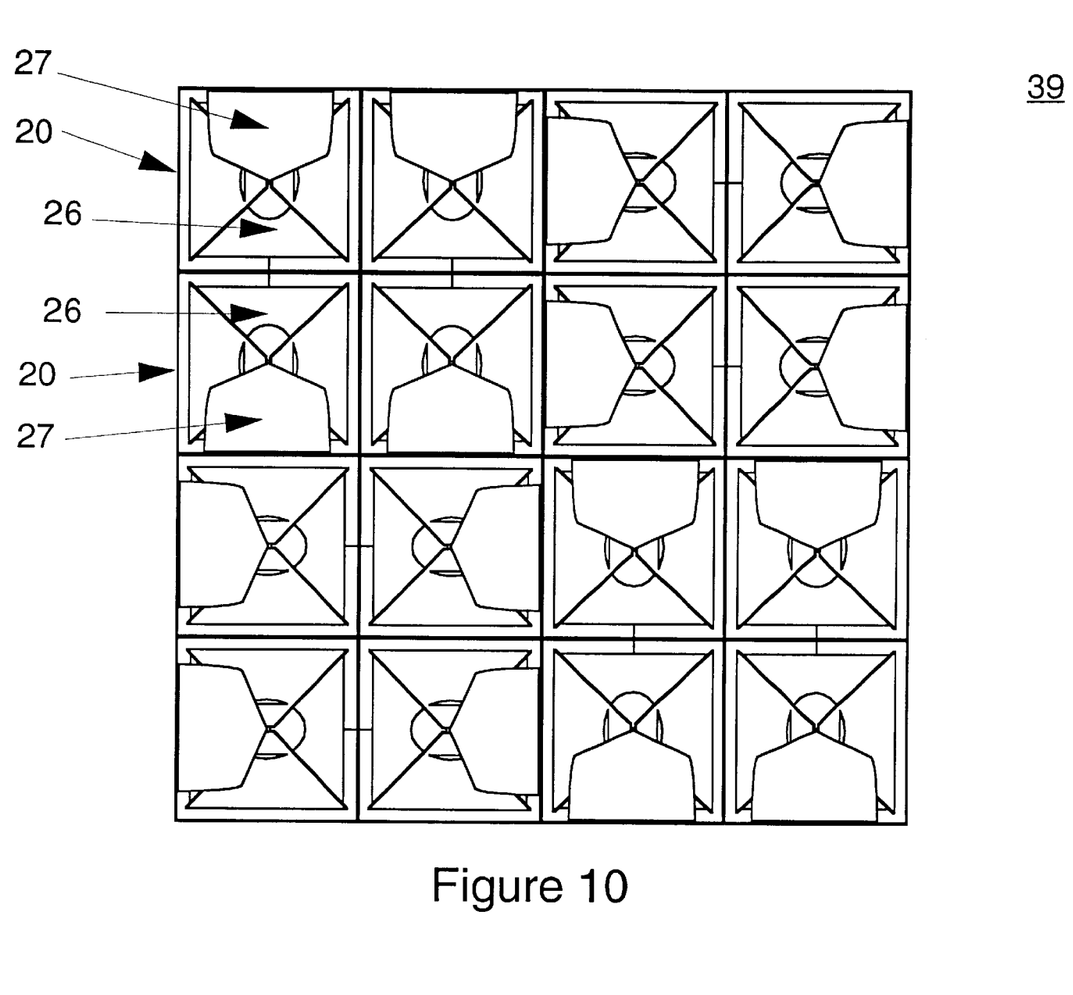
FIG. 10 is a face view of a mixed polarization array of dual antennas.

FIG. 10 shows a face view of a mixed polarized array of antennas 39 that produces mixed (vertical and horizontal) polarization. The array can be constructed with dual antennas 32 such as those of FIG. 3 or with individual antennas 20 such as those of FIG. 1. The following describes the construction using individual antennas:

The mixed polarized array consists of sub-arrays, with each sub-array containing four antennas. In each sub-array two identical antennas are combined with two antennas having both their orientation and the phase of their input signals inverted by 180°. The resulting electromagnetic field output of each of the individual antennas in the sub-array thus has the same polarization. Half of the sub-arrays are vertically polarized and the other half of the sub-arrays are horizontally polarized. For the sub-arrays with vertically polarized antennas the septums of individual antennas are placed horizontally. For the sub-arrays with horizontally polarized antennas the septums of individual antennas are placed vertically. Depending upon the angular resolution of the individual antenna beams and the antenna array focusing or de-focusing, the combined electromagnetic field can be tailored to meet the electromagnetic field requirements (intensity, polarization, distance and area of illumination). Depending on the mixing of the vertical and horizontal polarization signals, such antennas could have variable polarization. For clarity, the absorbing arrays of the individual antennas are not shown.

Figure 11:
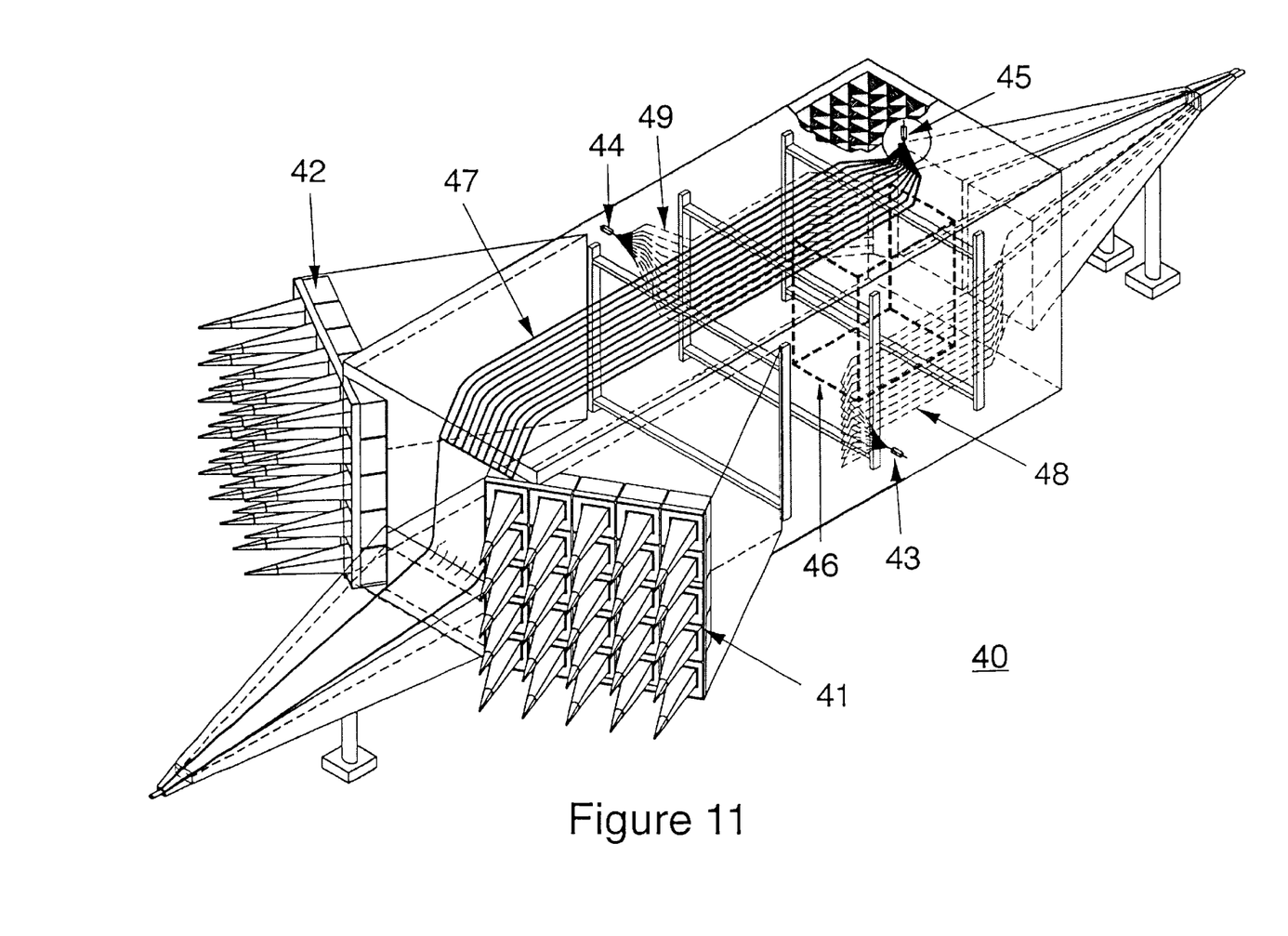
FIG. 11 is a perspective view of a broadband Gigahertz field test facility showing uniform field antenna arrays.

FIG. 11 shows a broadband Gigahertz field test facility 40 showing uniform-field antenna arrays 41 42. It is a modified form of the electromagnetic field test facility of U.S. Pat. No. 5,982,331. The testing area 46 is defined by the dashed lines. To expand the frequency range of the broadband Gigahertz field test facility from the 5 GHz upper limit to 100 GHz, the known arrangement can be varied by using diverging or converging lenses in front of the horn antennas, or adding antenna arrays either with or without lenses, on the side of the test enclosure as shown at 41 and 42 in FIG. 11. For details of the remaining features of the test facility, reference may be made to U.S. Pat. No. 5,982,331 which is hereby incorporated by reference.

It has been found unexpectedly that the broadband Gigahertz field test facility of U.S. Pat. No. 5,982,331 can also be used for magnetic field measurements from DC to 30 MHz. In the Broadband Gigahertz field facility of U.S. Pat. No. 5,982,331, the TEM-lines 47 48 49 are terminated with 50 ohm resistors 43 44 45 ensuring operation in the frequency range from DC to 50 MHz, while the broadband horn antennas started operating at 80 MHz. In the region from 50 to 80 MHz, the operation of the TEM-lines and the horn antennas overlap, to ensure a uniform frequency coverage extending from DC to Gigahertz frequencies. Such configuration allows conducting E-Field (electric field) radiated immunity and emission testing in accordance with Standard IEC 61000-4-3 and ANCI C63.4 and FCC Part 15 criteria. By replacing the 50 ohm terminations 43 44 45 at the end of each of the TEM-lines in the broadband Gigahertz field test facility with direct shorts, the facility becomes suitable for the measurements of H-field radiated emission and immunity testing from 60 Hz to 30 MHz in accordance with Bellcore GR 1089-CORE.

Figure 12:
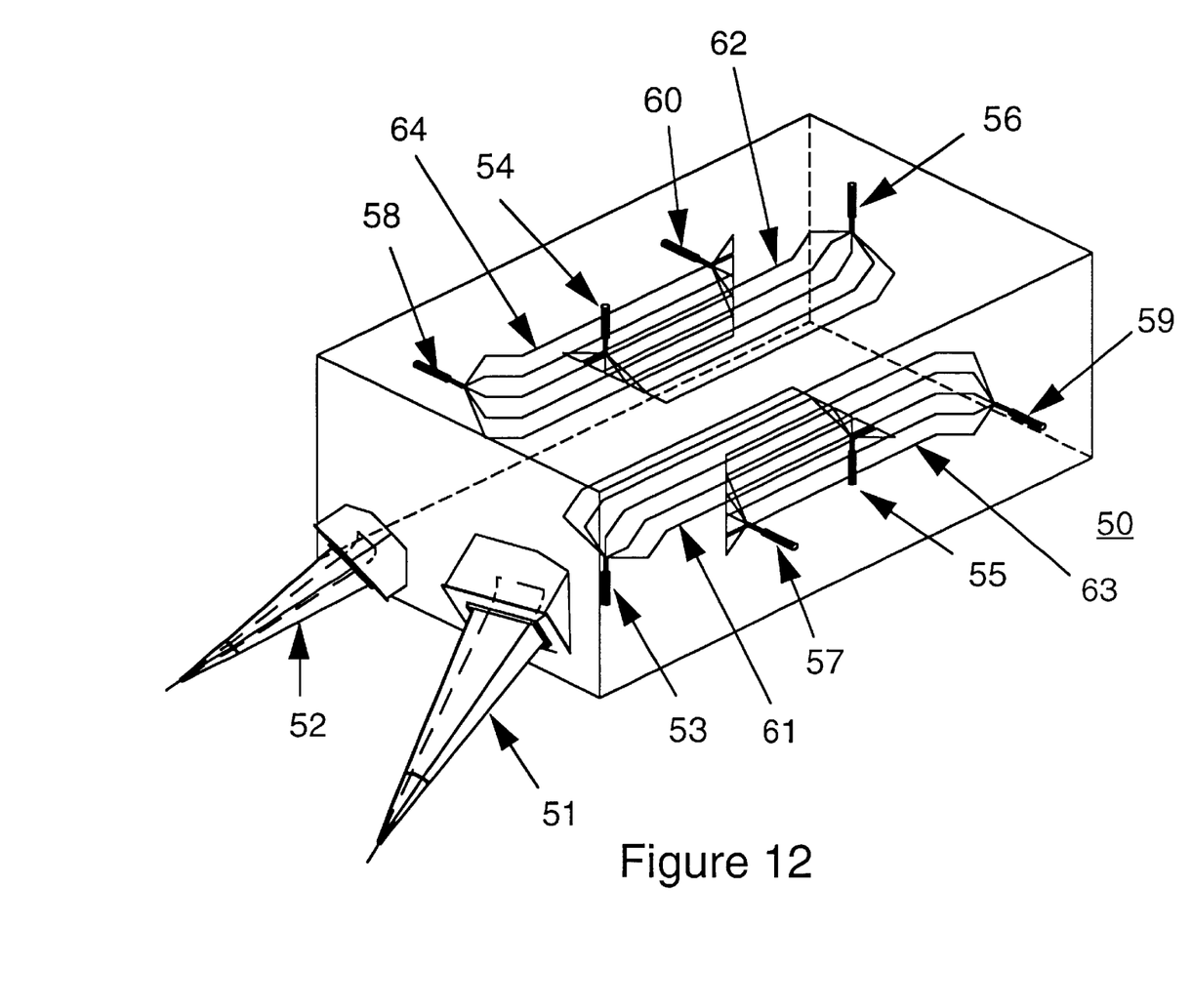
FIG. 12 is a perspective view of a broadband Gigahertz field reverberation chamber.

FIG. 12 shows a broadband Gigahertz field reverberation chamber 50. Normally, reverberation chambers operate with a lower limit of approximately 200 MHz. This is mainly due to the loading of the chamber (lowering the Q of the chamber), when low-frequency (large size) antennas are used.

To allow objects to be tested at frequencies lower than the low frequency limit of operation of a reverberation chamber, two sets of TEM-mode lines (a vertically polarized set 61 62 and a horizontally polarized set 63 64) are added inside the chamber 50 of FIG. 12 and instead of horn antennas (frequently installed inside the chamber), broadband Gigahertz field antennas 51 52 such as those of FIGS. 1 to 10 are provided on the walls of the chamber.

The two sets of TEM-mode lines 61 62 63 64 can either be fully symmetrical, as in FIG. 12 or asymmetrical; by removing one TEM-mode line from the set of either one or both of the vertical 61 62 and/or horizontal 63 64 TEM-mode lines.

For electric field simulation and measurements at low frequencies (DC to 50 MHz), depending on the polarization to be used, the input signal is applied or measured at the terminations 53 54 57 58 of either one or both of the vertical 61 62 and/or horizontal 63 64 TEM-mode lines, with all TEM-mode line terminations 53 54 57 58 55 56 59 60 terminated with 50 ohm resistors.

For electric field simulation and measurements at frequencies of 50 MHz to 5 GHz, the input signal is applied to or measured at broadband Gigahertz field antenna 51 operating from 50 MHz to 5 GHz, while all TEM-mode lines are terminated with direct shorts at 53 54 55 56 57 58 59 60. The ratio between the size of the mouth of the horn antennas and the size of the area of the chamber walls must be equal to 1/Q of the Chamber. As well, the septums of the broadband Gigahertz field horn antennas are shortened so that they do not penetrate into the Chamber. The absorbers normally placed around the mouth of the horns are removed. Depending upon the size of the Reverberation Chamber the length of the TEM mode lines is tuned (shortened or lengthened), to achieve the most uniform power spectral and spatial density.

For electric field simulation and measurements at frequencies from 1 GHz to 100 GHz, the input signal is applied to or measured at the broadband Gigahertz field antenna 52 operating from 1 GHz to 100 GHz, while all TEM-mode lines are terminated with direct shorts at 53 54 55 56 57 58 59 60. The ratio between the size of the mouth of the horn antennas and the size of the area of the chamber walls must be equal to 1/Q of the Chamber. As well, the septums of the broadband Gigahertz field horn antennas are shortened so that they do not penetrate into the Chamber. The absorbers normally placed around the mouth of the horns are removed. At this frequency range use of an antenna array can be advantageous.

For magnetic field simulation and measurements at low frequencies (DC to 30 MHz), depending on the polarization to be used, the input signal is applied or measured at the terminations 53 54 57 58 of either one or both of the vertical 61 62 and/or horizontal 63 64 TEM-mode lines. All terminations where the input signal is either applied or measured are terminated with 50 ohm resistors. All remaining TEM-mode lines are terminated with direct shorts.

What is claimed is:

1. An antenna comprising,
    a horn having a septum therein adjacent one wall thereof and electrically isolated from the horn, the end of the septum outside the mouth of the horn curving towards the adjacent wall,
    an electromagnetic absorbing array surrounding the mouth of the horn, and
    resistive coupling between the forward edge of the septum and the wall of the horn adjacent to it to absorb energy propagated between the septum and its adjacent wall.

2. An antenna as defined in claim 1 further comprising a lens aligned with the mouth of the horn and spaced forwardly thereof.

3. An array of antennas each as set out in claim 1 wherein the array defines a generally convex surface.

4. An array of antennas each as set out in claim 1 wherein the array defines a generally concave surface.

5. An array of antennas each as set out in claim 1 wherein the array defines a generally flat surface.

6. An array of antennas as set out in claim 5 wherein each antenna radiates energy having the same polarization.

7. An array of antennas as defined in claim 5 wherein some of the antennas radiate energy with different polarization.

8. An array of antennas as defined in claim 7 wherein a first half of the antennas have one direction of polarization and a second half of the antennas have a direction of polarization orthogonal that of the first half of the antennas.

9. An antenna comprising,
    a pair of horns with a common wall, each horn having a septum therein adjacent a wall opposite the common wall and electrically isolated from the horn, each septum curving towards its adjacent wall outside the mouth of the horn,
    an electromagnetic absorbing array surrounding the perimeter of the mouths of the horns, and
    resistive coupling between the forward edge of each septum and the wall of the horn adjacent the septum.

10. An array of antennas each as set out in claim 9 wherein the array defines a generally convex surface.

11. An array of antennas each as set out in claim 9 wherein the array defines a generally concave surface.

12. An array of antennas each as set out in claim 9 wherein the array defines a generally flat surface.

13. An array of antennas as set out in claim 12 wherein each antenna radiates energy having the same polarization.

14. An array of antennas as defined in claim 12 wherein some of the antennas radiate energy with different polarization.

15. An array of antennas as defined in claim 14 wherein a first half of the antennas have one direction of polarization and a second half of the antennas have a direction of polarization orthogonal that of the first half of the antennas.

16. A electromagnetic field test facility comprising a closed conducting reverberation chamber,
    first and second pairs of opposed arrays of conductors orthogonally arranged adjacent opposed walls of the chamber and defining a test volume therebetween,
    a radiating horn assembly positioned in an end wall of the assembly to establish an electromagnetic field in the test volume, and
    means terminating the arrays of conductors to establish a selected polarization of said electromagnetic field.

17. In a field test facility consisting of an anechoic or semi-anechoic chamber with inwardly facing horn antennas at opposite facing walls, the antennas being connected to conducting arrays extending forwardly into the chamber and defining a test volume therein, the improvement comprising:
    a pair of inwardly directed antenna arrays located at corners of the chamber to illuminate the test volume, whereby the facility can operate at high frequencies and at selected polarization.

18. A method of magnetic field testing using the chamber of claim 17, wherein the conducting arrays are terminated by connection to ground.

19. A method of magnetic field testing using an anechoic or semi-anechoic chamber with inwardly facing horn antennas at opposite facing walls, the antennas being connected to conducting arrays extending forwardly into the chamber and defining a test volume therein, wherein the conducting arrays are terminated by connection to ground.

20. In a field test facility consisting of an anechoic or semi-anechoic chamber with inwardly facing horn antennas at opposite facing walls, the antennas being connected to conducting arrays extending forwardly into the chamber and defining a test volume therein, the improvement comprising:
    a pair of inwardly directed antennas having lenses located at corners of the chamber to illuminate the test volume, whereby the facility can operate at high frequencies and at selected polarization.

* * * * *